United States Patent

Nuijten

(10) Patent No.: US 6,556,161 B2
(45) Date of Patent: Apr. 29, 2003

(54) DIGITAL TO ANALOG CONVERTER EMPLOYING DYNAMIC ELEMENT MATCHING

(75) Inventor: Petrus Antonius Cornelis Maria Nuijten, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/825,280

(22) Filed: Apr. 3, 2001

(65) Prior Publication Data

US 2001/0026235 A1 Oct. 4, 2001

(30) Foreign Application Priority Data

Apr. 4, 2000 (EP) .......................... 00201224.3
May 4, 2000 (EP) .......................... 00201617.8

(51) Int. Cl.[7] .............................. H03M 1/66
(52) U.S. Cl. ................. 341/144; 341/118; 341/120; 341/143; 341/150; 341/153
(58) Field of Search ................. 341/144, 153, 341/150, 143, 118, 120

(56) References Cited

U.S. PATENT DOCUMENTS

| | | | |
|---|---|---|---|
| 3,982,172 A | | 9/1976 | Van de Plassche ............ 323/1 |
| 4,703,310 A | | 10/1987 | Van de Plassche ......... 340/347 |
| 5,406,283 A | * | 4/1995 | Leung .......................... 341/143 |
| 5,872,532 A | * | 2/1999 | Yasuda ........................ 341/143 |
| 5,990,819 A | * | 11/1999 | Fujimori ...................... 341/150 |
| 6,236,346 B1 | * | 5/2001 | Schofield et al. ........... 341/144 |
| 6,304,608 B1 | * | 10/2001 | Chen et al. .................. 341/143 |

OTHER PUBLICATIONS

PHN 17,689, U.S. Ser. No. 09/698,762, Filed Oct. 27, 2000.
"A 10–b 70–MS/s CMOS D/A Converter", by Y. Nakamura et al., IEEE Journal of Solid State Circuits, vol. 26, No. 4, Apr. 1991.
"Linearity Enhancement of Multibit Delta Sigma A/D and D/A Converters using Data Weighted Averaging", by R. T. Baird et al., IEEE Transactions on Circuits and Systems, vol. 42, No. 12, Dec. 1995.

* cited by examiner

Primary Examiner—Michael Tokar
Assistant Examiner—Linh Van Nguyen
(74) Attorney, Agent, or Firm—Steven R. Biren

(57) ABSTRACT

A digital to analog converter for converting a multi bit digital input signal into an analog output signal. The converter includes a plurality of substantially equal conversion elements on a semiconductor chip and which are selected in accordance with a dynamic element matching algorithm. The dynamic element matching algorithm is adapted to the position of the conversion elements on the semiconductor chip so as to improve the shaping of the noise caused by the systematic, i.e. position dependent, errors of the conversion elements.

19 Claims, 3 Drawing Sheets

| A | | | I | | | II | | | III | |
|---|---|---|---|---|---|---|---|---|---|---|
| 1 | -2.5 | | 1 | -2.5 | | 1 | -2.5 | | 1 | -2.5 |
| 2 | -2.3 | | 26 | 2.5 | | 26 | 2.5 | | 25 | 2.3 |
| 3 | -2.1 | | 2 | -2.3 | | 3 | -2.1 | | 3 | -2.1 |
| 4 | -1.9 | | 25 | 2.3 | | 24 | 2.1 | | 23 | 1.9 |
| 5 | -1.7 | | 3 | -2.1 | | 5 | -1.7 | | 5 | -1.7 |
| 6 | -1.5 | | 24 | 2.1 | | 22 | 1.7 | | 21 | 1.5 |
| 7 | -1.3 | | 4 | -1.9 | | 7 | -1.3 | | 7 | -1.3 |
| 8 | -1.1 | | 23 | 1.9 | | 20 | 1.3 | | 19 | 1.1 |
| 9 | -0.9 | | 5 | -1.7 | | 9 | -0.9 | | 9 | -0.9 |
| 10 | -0.7 | | 22 | 1.7 | | 18 | 0.9 | | 17 | 0.7 |
| 11 | -0.5 | | 6 | -1.5 | | 11 | -0.5 | | 11 | -0.5 |
| 12 | -0.3 | | 21 | 1.5 | | 16 | 0.5 | | 15 | 0.3 |
| 13 | -0.1 | | 7 | -1.3 | | 13 | -0.1 | | 13 | -0.1 |
| 14 | 0.1 | | 20 | 1.3 | | 14 | 0.1 | | 14 | 0.1 |
| 15 | 0.3 | | 8 | -1.1 | | 12 | -0.3 | | 12 | -0.3 |
| 16 | 0.5 | | 19 | 1.1 | | 15 | 0.3 | | 16 | 0.5 |
| 17 | 0.7 | | 9 | -0.9 | | 10 | -0.7 | | 10 | -0.7 |
| 18 | 0.9 | | 18 | 0.9 | | 17 | 0.7 | | 18 | 0.9 |
| 19 | 1.1 | | 10 | -0.7 | | 8 | -1.1 | | 8 | -1.1 |
| 20 | 1.3 | | 17 | 0.7 | | 19 | 1.1 | | 20 | 1.3 |
| 21 | 1.5 | | 11 | -0.5 | | 6 | -1.5 | | 6 | -1.5 |
| 22 | 1.7 | | 16 | 0.5 | | 21 | 1.5 | | 22 | 1.7 |
| 23 | 1.9 | | 12 | -0.3 | | 4 | -1.9 | | 4 | -1.9 |
| 24 | 2.1 | | 15 | 0.3 | | 23 | 1.9 | | 24 | 2.1 |
| 25 | 2.3 | | 13 | -0.1 | | 2 | -2.3 | | 2 | -2.3 |
| 26 | 2.5 | | 14 | 0.1 | | 25 | 2.3 | | 26 | 2.5 |
| 1 | -2.5 | | 1 | -2.5 | | 1 | -2.5 | | 1 | -2.5 |
| 2 | -2.3 | | 26 | 2.5 | | 26 | 2.5 | | 25 | 2.3 |
| 3 | -2.1 | | 2 | -2.3 | | 3 | -2.1 | | 3 | -2.1 |
| 4 | -1.9 | | 25 | 2.3 | | 24 | 2.1 | | 23 | 1.9 |
| 5 | -1.7 | | 3 | -2.1 | | 5 | -1.7 | | 5 | -1.7 |
| 6 | -1.5 | | 24 | 2.1 | | 22 | 1.7 | | 21 | 1.5 |
| 7 | -1.3 | | 4 | -1.9 | | 7 | -1.3 | | 7 | -1.3 |
| 8 | -1.1 | | 23 | 1.9 | | 20 | 1.3 | | 19 | 1.1 |
| 9 | -0.9 | | 5 | -1.7 | | 9 | -0.9 | | 9 | -0.9 |
| 10 | -0.7 | | 22 | 1.7 | | 18 | 0.9 | | 17 | 0.7 |
| 11 | -0.5 | | 6 | -1.5 | | 11 | -0.5 | | 11 | -0.5 |
| 12 | -0.3 | | 21 | 1.5 | | 16 | 0.5 | | 15 | 0.3 |
| 13 | -0.1 | | 7 | -1.3 | | 13 | -0.1 | | 13 | -0.1 |
| 14 | 0.1 | | 20 | 1.3 | | 14 | 0.1 | | 14 | 0.1 |
| 15 | 0.3 | | 8 | -1.1 | | 12 | -0.3 | | 12 | -0.3 |

FIG. 5

DIGITAL TO ANALOG CONVERTER EMPLOYING DYNAMIC ELEMENT MATCHING

BACKGROUND OF THE INVENTION

This invention relates to a digital to analog converter for converting a multi bit digital input signal into an analog output signal. The converter comprises an array of substantially equal conversion elements on a semiconductor chip and conversion element selection logic for selecting, in response to the multi bit digital input signal, from said array of conversion elements a number of signal-conversion elements for connection to an output terminal, the selection logic being adapted to perform a dynamic element matching algorithm for shaping the noise, caused by the inequalities of the conversion elements, to higher frequencies. A digital to analog converter of this kind is, for example, known from the article: "Linearity Enhancement of Multibit Delta Sigma A/D and D/A Converters Using Data Weighted Averaging" by R. T. Baird and T. S. Fiez in IEEE Transactions on Circuits and Systems-II: analog and digital signal processing, Vol. 42, No. 12, pp. 753–762, December 1995.

In many cases, such as video or high resolution audio, the use of multi bit analog to digital converters is preferred over single-bit converters. The quantization-noise level of the multi bit quantizers is inherently lower than that of single-bit quantizers (the theoretical signal to noise ratio of the system improves by approximately 6 dB per bit). Moreover, multi bit converters also have the advantage of being less sensitive to sample-clock jitter and intersymbol interference.

The improvement of the dynamic range of multi bit converters however only comes at the cost of severe linearity problems. When the value of the conversion elements is not exactly equal, the quantization levels are not exactly equidistant, the converter is non-linear and severe harmonic distortion in the output signal is generated. It is well known in the art, e.g. from the U.S. Pat. Nos. 3,982,172 and 4,703,310 of R. J. van de Plassche, to improve the linearity of multi bit converters by techniques of dynamic element matching. These techniques do not rely on analog accuracies and are therefore often preferred in modern IC processes. Although, of course, for converting a certain value of the digital input signal, the corresponding number of conversion elements is selected, the technique of dynamic element matching seeks to avoid that for each conversion the same conversion elements are selected. Therefore dynamic element matching decorrelates the mismatch errors of the conversion elements from the input signal, thereby reducing non-linear distortion, i.e. the generation of higher harmonics in the analog output signal. Some special kinds of dynamic element matching do not only decorrelate the mismatch errors from the input signal, but additionally "shape" the noise, caused by the inequalities of the conversion elements, out of the frequency band of interest. A simple and preferred method of dynamic element matching, belonging to this latter category, is the Data Weighted Averaging (DWA) algorithm, which is described in the above referenced article. In this algorithm, for each conversion the next K unit elements are used, K being the number of elements to be selected. In this way, a cyclic assignment of conversion elements is obtained, so that the error that is caused by the mismatch, is averaged much faster and thus the mismatch error becomes a high-frequency error by first-order shaping.

SUMMARY OF THE INVENTION

Although the above described known method of dynamic element matching shapes the noise to higher frequencies and thereby increases the signal to noise ratio of the analog to digital converter, the present invention recognizes that still better noise shaping and consequently further improved signal to noise ratio can be obtained. The analog to digital converter of the present invention is therefore characterized in that the selection by the dynamic element matching algorithm is adapted to the position of the conversion elements in said array so as to improve the shaping to higher frequencies of the noise caused by the systematic inequalities of the conversion elements.

The present invention is based on the per se known recognition that in IC implementation the errors of the conversion elements have almost always a random part and a systematic part. The systematic errors are caused by the occurrence of all kinds of gradients and variations during the manufacturing process of the integrated circuit, such as temperature gradients, doping concentration gradients, oxide thickness gradients and misalignment of masks. The invention recognizes that the course of the systematic errors of the conversion elements is predictable, that a better shaping of individual errors is obtained when a positive error (with respect to the mean value of the elements) is quickly compensated by a negative error of comparable magnitude and that, consequently, the dynamic matching algorithm can be adapted to optimize the shaping to higher frequencies of the mismatch noise which is caused by the systematic errors.

In most cases the conversion elements are arranged on the semiconductor chip in a row. In those cases often a linear gradient in the values of the individual elements is observed. Therefore, in those cases where at least part of the conversion elements is situated in a linear array of conversion elements, the analog to digital converter of the invention may be characterized in that the selection logic is arranged to select at least the majority of the conversion elements of the linear array in pairs of two conversion elements which lie in different halves of the linear array. More particularly, such digital to analog converter may be characterized in that the two conversion elements of each of said pairs lie substantially symmetrically with respect to the centre of the linear array.

Apart from selecting the conversion elements in pairs of two elements lying on both sides of the centre of the linear array and more particularly lying symmetrically with respect to the centre of the array, a further improvement may likely be obtained in case of lower oversampling ratios, by properly choosing the succession in which the pairs are selected and therefore the digital to analog converter of the invention may be further characterized in that the said pairs of conversion elements are successively selected so that in each half of the linear array every second element is selected in one direction and subsequently every second of the elements lying there between is selected in the opposite direction. A digital to analog converter with a slightly different selection algorithm may be characterized in that the second element of a pair and the element lying between the first element of said pair and the first element of the next pair, lie symmetrically with respect to the centre of the linear array.

BRIEF DESCRIPTION OF THE DRAWING

The invention will be further explained with reference to the attached figures. Herein shows.

DESCRIPTION OF THE PREFERRED EMBODIMENTS

Figure 1:
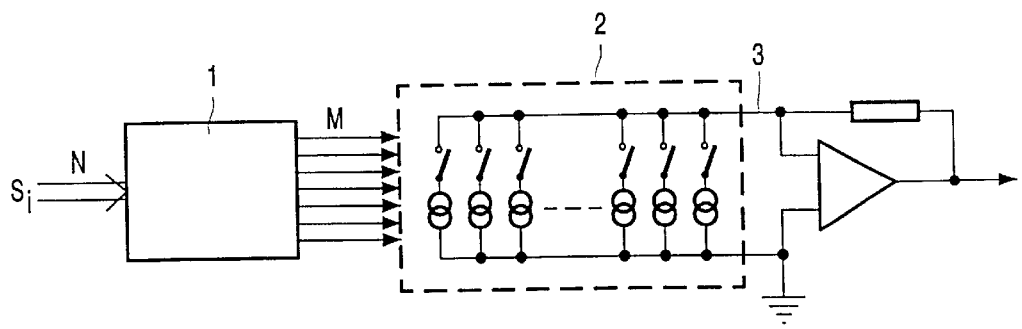
FIG. 1 a simplified schematic diagram of a digital to analog converter in which the invention may be used, FIG. 2 a conversion element selection scheme which is known in the art, FIG. 3 a conversion element selection scheme of a digital to analog converter according to the invention, FIG. 4 curves representing possible courses of the values of the conversion elements, and FIG. 5 alternative conversion element selection schemes of a digital to analog converter according to the invention.

The digital to analog converter of FIG. 1 comprises a conversion element selection logic 1 which is controlled by a multi bit digital input signal Si. The input signal Si has N bits. The selection logic 1 is connected through a plurality of M lines to an array 2 of M selectable conversion elements whereby each of the M conversion elements is controlled by one of the M lines. The conversion elements are preferably constituted as current sources, however it is also possible to use e.g. voltage sources or capacitances as conversion elements.

The maximum number of individually selectable conversion elements is equal to $2^N-1$ and the primary function of the selection logic is to convert the value represented by the bits of the input signal to a corresponding number of selected lines and of selected conversion elements. Therefore, when the value represented by the input signal is K, then the selection logic 1 makes K of its M output lines high so that K current sources of the array 2 are selected. The summed current of these selected current sources is fed to an output terminal 3. In the embodiment of FIG. 1 this analog output current is fed to an operational amplifier which is fed back through a resistor. This arrangement converts the analog output current into an analog output voltage. It is noted that the currents of the not-selected sources of the array 2 are dumped to any suitable well known dump. The alternative, namely switching the sources on and off, is not preferred because the switching off of a current source gives substantially more delay, with less steep edges, than redirecting the current of the source.

The simplest prior art method of selecting the current sources by the selection logic is to select only the first current source when the input signal value K=1, the first two current sources when K=2, the first three current sources when K=3 and so on. This so called thermometer code suffers from high non linear distortion and high in-band noise when the values of the current sources are not exactly equal.

Figure 2:
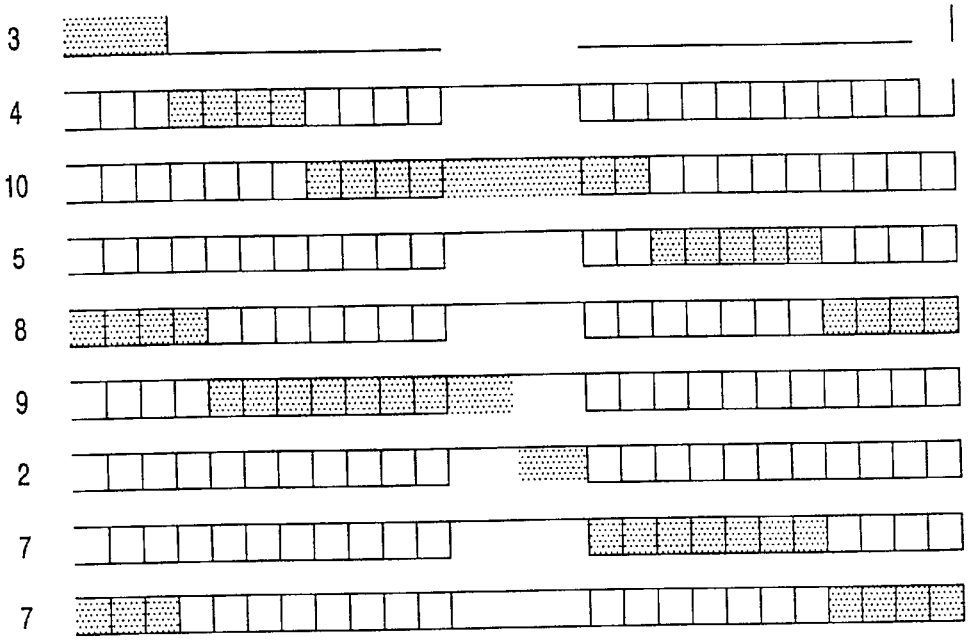

To minimize these problems, the selection logic may carry out a dynamic element matching algorithm, with the object to reduce non-linear distortion of the signal and to shape the noise, which is caused by the mismatch between the current sources, to higher frequencies outside the frequency band of interest. A simple, efficient and well known dynamic element matching algorithm, which is called "Data Weighted Averaging" (DWA) is illustrated in the selection scheme of FIG. 2 for a particular input signal sequence 3,4,10,5,8,9,2,7,7. The selected current sources are displayed blocked and the non-selected current sources are displayed blank. As shown, the number of selected conversion elements corresponds to the magnitude of the input signal to be converted. However, instead of restarting each conversion with the first current source, each conversion is now started with the current source next to the last source selected during the previous conversion. When, during a conversion, the last one of the current sources is selected, the conversion continues, in a cyclically permuting fashion, with the first one. In the figure a total of 26 conversion elements are shown, but in practice some other number of conversion elements may be used. The upper row in FIG. 2 represents the numbers of the individual current sources.

Figure 3:
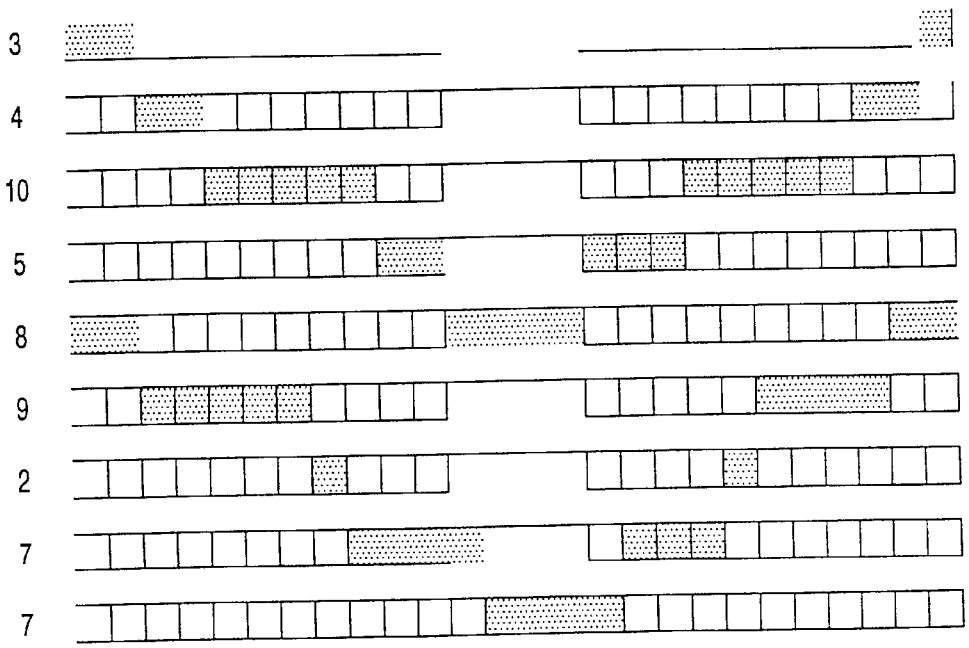

An improved selection algorithm is shown in FIG. 3. In this figure it is assumed that the current sources are situated on a semiconductor chip in a linear array. The inequalities of the current sources are partly of individual nature, i.e. the values of the current sources may vary from chip to chip, and partly of systematic nature, i.e. the errors in the array of current sources are the same for all the chips and are therefore known and predictable. The systematic errors usually stem from production gradients, such as temperature, doping concentration and oxide thickness gradients.

Figure 4:
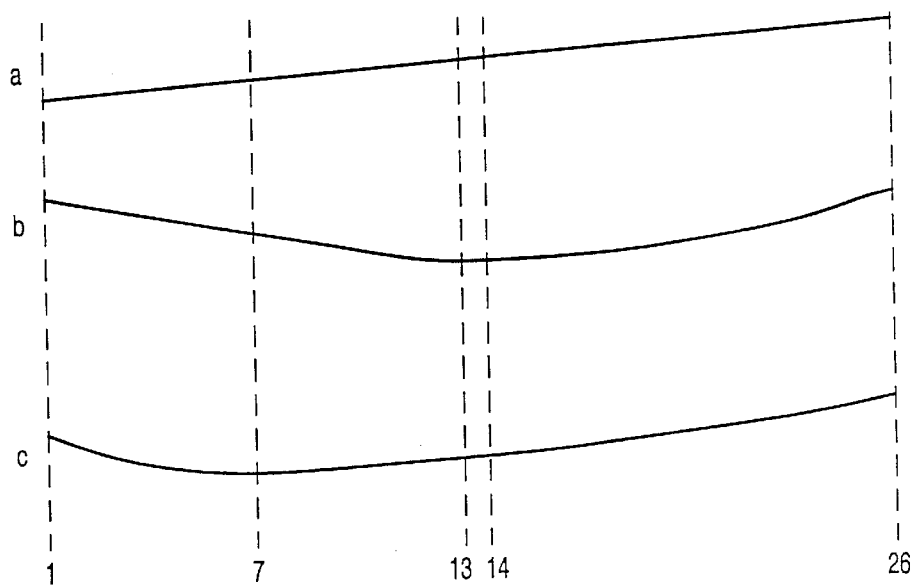

In the selection algorithm of FIG. 3, it is assumed that the course of the systematic errors along the array of current sources is substantially linear (see FIG. 4 curve a). As in FIG. 2, the selected current sources are shown blocked and the non-selected current sources are shown blank. Also the same sequence of input signal values is taken as in FIG. 2. For the first conversion, to convert the digital input value 3 into analog format, the three current sources 1, 26 and 2 are selected, i.e. the source with the largest positive systematic error with respect to the mean value, the source with the largest negative systematic error, and the source with the largest but one positive systematic error. For the second conversion, to convert the digital value 4 into analog format, the four current sources 25, 3, 24, and 4 are selected, i.e. the source with the largest but one negative systematic error, the sources with the largest but two positive and negative errors and the source with the largest but three positive systematic error. For the third conversion which converts the digital signal value 10, the current sources 23, 5, 22, 6, 21, 7, 20, 8, 19 and 9 are selected and so on. Therefore, it can be seen that the current sources are selected in pairs of elements 1-26, 2-25, 3-24 etc. i.e. the current source with the largest positive systematic error is directly followed by the source with the largest negative systematic error and any source with a smaller positive systematic error is directly followed by a source with a substantially equal negative systematic error. With other words: a positive systematic error is compensated by a substantially equal negative systematic error, either instantaneously when both current sources are selected for the same conversion, or nearly instantaneously during the next selection. Consequently the systematic errors are shaped very effectively to higher frequency bands. Calculations show that with this algorithm signal/noise improvements of more than 10 dB with respect to the algorithm of FIG. 2 may be obtained.

It may be observed that the selection algorithm as described with reference to FIG. 3 is suitable to shape the noise from systematic errors with any linear course along the array of conversion elements. For instance, higher as well as lower levels of systematic errors and systematic errors which vary from positive to negative values as well errors which vary from negative to positive values are all shaped with the same algorithm. Therefore, it is often not necessary to know exactly the magnitude and the course of the systematic errors. When it may be expected that the course of the systematic errors is substantially linear, the algorithm as depicted with reference to FIG. 3 may appear advantageous.

It is further noted, that the succession of the pairs of selected elements is not of interest. Of importance is that the selection of an element with a certain systematic error, with respect to the mean value, is followed as soon as possible by the selection of an element with a substantially equal but opposite systematic value, again with respect to the mean value. If the number of conversion elements is uneven, this can easily be accommodated by replacing the pair of elements whose values are closest to the mean value, with the single element whose value is closest to the mean value.

In accordance with the invention a different algorithm is chosen when the course of the systematic errors substantially deviates from the linear course. For instance, if the course of the systematic errors is symmetrical, such as depicted in FIG. 4 curve b, then the selection of elements may e.g. be as follows:

1-13, 26-14, 2-12, 25-15, 3-11, 24-16, 4-10, 23-17, 5-9, 22-18, 6-8, 211-19, 7, 20. This selection algorithm would also be chosen when the course of the systematic errors would consist of two linear parts, one descending in one half of the array and the other ascending in the other half of the array.

If the course of the systematic errors is asymmetric, such as depicted in FIG. 4 curve c, then the selection of the conversion elements could be as follows:

26-7, 25-6, 24-8, 23-5, 22-9, 21-4, 20-10, 19-3, 18-11, 17-2, 16-12, 15-1, 14-13.

In the description given above with reference to FIGS. 3 and 4, it has been shown that a substantial improvement of the shaping of the systematic errors may be obtained by selecting the conversion elements in pairs, whose two constituting elements compensate each others systematic errors wholly or substantially. Especially in the case of lower oversampling ratios a further improvement of the noise shaping of the systematic errors may likely be obtained by properly choosing the succession in which the respective pairs of conversion elements are selected. This can be explained with reference to FIG. 5.

Herein it is assumed that there are, again, 26 conversion elements in a linear array, which are numbered from 1 to 26 and whose systematic errors run linearly from −2.5 to +2.5 which means that the systematic error increases by 0.2 from one element to the next. The numbers of the conversion elements with their respective systematic errors are depicted, vertically, in column A of FIG. 5.

When the elements are selected in pairs, as is described with reference to FIG. 3, the sequence of selection of the elements with their respective systematic errors is as depicted in column I of FIG. 5. From column I it is seen that the magnitude of the systematic errors gradually decreases from ±2.5 to ±0.1, then jumps to ±2.5, then again gradually decreases and so on. Therefore, large discontinuities appear in the sequence and a Fourier analysis of the waveform reveals that these discontinuities may in some cases cause a relatively large residual low frequency noise component in the analog output signal.

A waveform having a lower residual low frequency error is obtained when the 26 conversion elements (with their respective systematic errors) are selected according to the sequence, which is depicted in column II of FIG. 5. When this sequence II is repeated the large discontinuities in the systematic errors of sequence I do not anymore exist. It may be observed that the sequence II comprises pairs 1-26; 3-24; 5-22; - - - 4-23; 2-25; whose elements lie symmetrically with respect to the centre of the array as was also the case with the sequence I. However, in the sequence II, the uneven elements of the first half of the array (1 - - - 13) are selected upwardly from 1 to 13 and the even numbers are selected downwardly from 12 to 2. Equally, of the elements (14 - - - 26) of the second half of the array, the even numbers are selected downwardly from 26 to 14 and the uneven elements are selected upwardly from 15 to 25.

Another selection sequence is depicted in column III of FIG. 5. In this sequence the elements of the first halve of the array (1 - - - 13) are selected so that the uneven numbers are selected upwardly from 1 to 13 and the even numbers downwardly from 12 to 2, and of the elements of the second halve of the array (14 - - - 26) the even numbers are now selected upwardly from 14 to 26 and the uneven numbers downwardly from 25 to 15. In this sequence the elements of one pair do not lie symmetrically with respect to the centre of the array, but the second element of a pair lies symmetrically with the element lying between the first element of said pair and the first element of the next pair in the array.

The invention being explained with an array of 26 elements, may equally well be used with a smaller or larger number of elements. Of course in practice the selection of some of the elements may be changed without departing from the scope of the invention, especially of those elements whose systematic error with respect to the mean value of the conversion elements, is small. The invention may also be practiced with an uneven number of conversion elements, in which case it is of course not possible to arrange all elements in pairs.

The invention, which is described hereinbefore in connection with the simplest form of digital to analog converter, may be used in all kinds of multi bit d/a converters, such as d/a converters with dual sets of conversion elements and d/a converters with excess conversion elements as described in applicant's European patent application No. 99203538.6 (PHN 017689).

What is claimed is:

1. A digital to analog converter for converting a multi bit digital input signal into an analog output signal, the converter comprising: an array of substantially equal conversion elements on a semiconductor chip, and conversion element selection logic for selecting, in response to the multi bit digital input signal, from said array of conversion elements a number of signal-conversion elements for connection to an output terminal, the selection logic being adapted to perform a dynamic element matching algorithm for shaping the noise, caused by systematic inequalities of the conversion elements, to higher frequencies, characterized in that the selection by the dynamic element matching algorithm is adapted to the position of the conversion elements in said array so as to improve the shaping to higher frequencies of the noise caused by the systematic inequalities of the conversion elements.

2. A digital to analog converter as claimed in claim 1 wherein the array of conversion elements comprises a linear array of conversion elements, characterized in that the selection logic is arranged to select at least the majority of the conversion elements of the linear array in pairs of two conversion elements which lie in different halves of the linear array.

3. A digital to analog converter as claimed in claim 2, characterized in that the two conversion elements of each of said pairs lie substantially symmetrically with respect to a center of the linear array.

4. A digital to analog converter as claimed in claim 3, characterized in that said pairs of conversion elements are successively selected so that in each half of the linear array every second element is selected in one direction and subsequently every second one of the elements lying therebetween is selected in the opposite direction.

5. A digital to analog converter as claimed in claim 2, characterized in that said pairs of conversion elements are successively selected so that in each half of the linear array every second element is selected in one direction and subsequently every second of the elements lying therebetween is selected in the opposite direction.

6. A digital to analog converter as claimed in claim 5, characterized in that the second element of a pair, and the element lying between the first element of said pair and the first element of the next pair, lie symmetrically with respect to the center of the linear array.

7. A digital to analog converter as claimed in claim 2 wherein the second element of a pair, and the element lying between the first element of said pair and the first element of the next pair, lie symmetrically with respect to the center of the linear array.

8. The digital to analog converter as claimed in claim 2 where in the second conversion element of a pair of conversion elements lies symmetrically with respect to the conversion element lying between the first conversion element of said pair of conversion elements and the first conversion element of the next pair of conversion elements in the array of conversion elements, and in the first half of the array, the uneven numbered conversion elements are selected upwardly from the first to the last conversion element and the even numbered conversion elements are selected downwardly from approximately the last even numbered conversion element to the first even numbered conversion element, and in the second half of the array, the even numbered conversion elements are selected upwardly from approximately the first to the last conversion elements and the uneven numbered conversion elements are selected downwardly from approximately the last to the first uneven numbered conversion elements of the second half of the array of conversion elements.

9. A digital to analog converter as claimed in claim 1 wherein the array of conversion elements are linearly arranged on the semiconductor chip in a single line and each conversion element comprises a current source in series with a respective switching element controlled by the selection logic.

10. A digital to analog converter as claimed in claim 1 wherein the selection logic selects most of the conversion elements of the array in pairs of two conversion elements which lie in respective approximately equal positive and negative error positions on the semiconductor chip.

11. A digital to analog converter as claimed in claim 10 wherein the algorithm causes the selection logic to quickly compensate a positive error with a negative error of comparable magnitude, and vice versa.

12. The digital to analog converter as claimed in claim 10 wherein the selection logic selects at least most of the conversion elements in accordance with an algorithm whereby, in a first half of the array, the uneven numbered conversion elements are selected upwardly from the first conversion element to approximately the last conversion element of the first half of the array and the even numbered conversion elements are selected downwardly from approximately the last conversion element of the first half of the array to approximately the first even numbered conversion element of the first half of the array, and in the second half of the array the even numbered conversion elements are selected downwardly from the last conversion element of the second half of the array and the uneven numbered conversion elements are selected upwardly starting from approximately the first conversion element of the second half of the array, thereby to minimize any discontinuities in the sequence of systematic inequalities.

13. A digital to analog converter as claimed in claim 1 wherein the selection logic operates with an algorithm that produces a selection code other than a thermometer code.

14. A digital to analog converter as claimed in claim 1 wherein the selection logic selects most of the conversion elements of the array in pairs of two conversion elements having approximately equal positive and negative error compensation values.

15. The digital to analog converter as claimed in claim 1 wherein the multi-bit digital input signal has N bits and the maximum number of conversion elements available for selection is $2^N-1$, such that no extra conversion elements are required to perform the dynamic element matching algorithm.

16. A digital to analog converter for converting a digital input signal into an analog output signal, the converter comprising: an array of substantially equal conversion elements on a semiconductor chip, and conversion element selection logic for selecting, in response to the digital input signal, from said array of conversion elements a number of signal conversion elements for connection to an output terminal in accordance with a dynamic element matching algorithm, wherein the selection logic performs a dynamic element matching algorithm for shaping the noise, caused by position dependent inequalities of the conversion elements, to higher frequencies, and the conversion elements in said array are selected in accordance with the dynamic element matching algorithm so as to provide approximately equal positive and negative error compensation values.

17. A digital to analog converter as claimed in claim 16 wherein the array of conversion elements are linearly arranged on the semiconductor chip in a single line, and the selection logic, under control of the dynamic element matching algorithm, selects the conversion elements of the linear array in pairs of two conversion elements having approximately equal positive and negative error compensation values.

18. A digital to analog converter as claimed in claim 17 wherein the two conversion elements of each of said pairs lies substantially symmetrically with respect to a center of the linear array.

19. A digital to analog converter as claimed in claim 16 wherein the array of conversion elements are linearly arranged on the semiconductor chip and errors caused by the position dependent inequalities along the linear array of conversion elements are substantially linear, and the selection logic, under control of the dynamic element matching algorithm, selects the conversion elements of the linear array in pairs of two conversion elements having approximately equal positive and negative error compensation values.

* * * * *